(12) United States Patent
Meng et al.

(10) Patent No.: US 12,243,773 B2
(45) Date of Patent: Mar. 4, 2025

(54) LINER AND BARRIER LAYER IN DUAL DAMASCENE CU INTERCONNECT FOR ENHANCED EM AND PROCESS

(71) Applicant: SiEn (QingDao) Integrated Circuits Co., Ltd., Shandong (CN)

(72) Inventors: Zhaosheng Meng, Qingdao (CN); Zhuangzhuang Wu, Qingdao (CN); Min-Hwa Chi, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 562 days.

(21) Appl. No.: 17/563,347

(22) Filed: Dec. 28, 2021

(65) Prior Publication Data

US 2022/0216101 A1 Jul. 7, 2022

(30) Foreign Application Priority Data

Jan. 5, 2021 (CN) .......................... 202110005987.6

(51) Int. Cl.
| | | |
|---|---|---|
| *H01L 23/48* | (2006.01) | |
| *H01L 21/768* | (2006.01) | |
| *H01L 23/522* | (2006.01) | |
| *H01L 23/532* | (2006.01) | |

(52) U.S. Cl.
CPC .. *H01L 21/76846* (2013.01); *H01L 21/76802* (2013.01); *H01L 21/76877* (2013.01); *H01L 23/5226* (2013.01); *H01L 23/53238* (2013.01)

(58) Field of Classification Search
CPC ...................... H01L 23/5226; H01L 23/53238
USPC ................................................. 257/751, 753
See application file for complete search history.

(56) References Cited

U.S. PATENT DOCUMENTS

| | | | | |
|---|---|---|---|---|
| 9,378,976 | B2* | 6/2016 | Shaviv | .............. H01L 21/76822 |
| 9,680,105 | B2* | 6/2017 | Barth | ................ H01L 23/49838 |
| 2014/0124799 | A1* | 5/2014 | Youn | ...................... H01L 33/40 |
| | | | | 438/26 |
| 2015/0137377 | A1* | 5/2015 | Bao | .................... H01L 21/76849 |
| | | | | 257/758 |
| 2018/0033734 | A1* | 2/2018 | Zhou | ................. H01L 21/76885 |
| 2020/0243383 | A1* | 7/2020 | Huang | .............. H01L 23/53252 |
| 2021/0407925 | A1* | 12/2021 | Chang | ............... H01L 21/76805 |
| 2022/0102268 | A1* | 3/2022 | Alaan | ............... H01L 23/53238 |
| 2022/0157983 | A1* | 5/2022 | Or-Bach | ........... H01L 29/66795 |
| 2023/0393008 | A1* | 12/2023 | Marya | ....................... G01L 9/12 |

* cited by examiner

*Primary Examiner* — Nitin Parekh
(74) *Attorney, Agent, or Firm* — Chen Yoshimura LLP

(57) ABSTRACT

A Cu interconnect and a method of forming a Cu interconnect of damascene process is provided. A barrier layer is formed at a sidewall and a bottom of a through hole and a groove, constructing a Cu interconnecting line. The barrier layer comprises a metal crystal adhesion layer or a graphene layer. The metal crystal adhesion layer may be a Co, Ru or Os crystal layer. The metal crystal adhesion layer may enhance adhesion of Cu, inhibit diffusion of Cu toward a dielectric layer efficiently, and promoting electro-migration of Cu. The graphene layer may be an Carbon allotrope/ graphene complex layer. The graphene layer may provide lower resistance for the Cu interconnect and increase adhesion between barrier and dielectric layer to improve EM. Both the metal crystal adhesion layer and the graphene layer may efficiently reduce the total thickness of the barrier layer and the first barrier layer to efficiently decrease resistance of the through hole.

6 Claims, 7 Drawing Sheets

LINER AND BARRIER LAYER IN DUAL DAMASCENE CU INTERCONNECT FOR ENHANCED EM AND PROCESS

FIELD OF THE INVENTION

The present invention relates to semiconductor devices, and especially relates to a Cu interconnect and a method of forming a Cu interconnect of damascene process.

BACKGROUND OF THE INVENTION

A resistance-capacitance (RC) delay in an interconnect is a major factor affecting performance of a logic circuit. Since 0.13 μm CMOS technology, copper (Cu) is widely used to form interconnects in light of its lower resistivity. However, Cu tends to diffuse to a low-k dielectric layer, so as to reduce its electro-migration (EM).

Conventionally, Ta/TaN is generally used as a material to form a barrier layer of a Cu interconnect of dual damascene process to prevent from diffusion of Cu. Unfortunately, as CMOS in BEOL keeps shrinking, traditional Ta/TaN pad layer and barrier layer for the Cu interconnect of dual damascene process cannot prevent from diffusion of Cu and reduce resistance of a through hole and adhesion of Cu well, and this results in bad electro-migration of Cu. Therefore, a better material for interconnect to replace the Ta/TaN multilayers is needed.

SUMMARY OF THE INVENTION

In light of above-mentioned problems and defects in Cu interconnect of dual damascene process, the present invention provides a Cu interconnect and a method of forming a Cu interconnect of damascene process. A barrier layer may be formed at a sidewall and a bottom of a through hole and a groove. The barrier layer may comprise a metal crystal adhesion layer or a graphene layer. The metal crystal adhesion layer may be a Co, Ru or Os crystal layer, and its metal crystal may be in hexagonal close-packed (HCP) crystal structure or face-centered cubic (FCC) crystal structure. The graphene layer may be a Carbon allotrope and graphene complex layer (Carbon allotrope/graphene complex layer). The metal crystal adhesion layer or the graphene layer may enhance Cu's adhesion of Cu, inhibit Cu's diffusion toward a dielectric layer efficiently, especially a low-k dielectric layer, and so as to promote Cu's electro-migration of Cu.

An aspect of the present invention provides a method of forming a Cu interconnect of damascene process, comprising steps of: forming a dielectric layer on a substrate; forming a through hole and a groove in the dielectric layer; forming a barrier layer at a sidewall and a bottom of the through hole and a sidewall and a bottom of the groove, the barrier layer comprising a metal crystal adhesion layer or comprising a graphene layer; and filling the through hole and groove with copper to form a Cu interconnect.

Optionally, if the barrier layer comprises the metal crystal adhesion layer, the step of forming a barrier layer at a sidewall and a bottom of the through hole and a sidewall and a bottom of the groove further comprises steps of: forming metal and/or metal compound as a first barrier layer at the sidewall and the bottom of the through hole and the sidewall and the bottom of the groove; through chemical vapor deposition, forming amorphous metal pad layer on the first barrier layer which is at the sidewall of the through hole and the sidewall of the groove; and through physical vapor deposition, forming the metal crystal adhesion layer on the amorphous metal pad layer.

Optionally, if the barrier layer comprises the metal crystal adhesion layer, the step of forming a barrier layer at a sidewall and a bottom of the through hole and a sidewall and a bottom of the groove further comprises steps of: forming metal and/or metal compound as a first barrier layer at the sidewall and the bottom of the through hole and the sidewall and the bottom of the groove; through chemical vapor deposition, forming amorphous metal pad layer on the first barrier layer which is at the sidewall of the through hole and the sidewall of the groove; and through physical vapor deposition, forming the metal crystal adhesion layer on the amorphous metal pad layer.

Optionally, the metal crystal adhesion layer may be cobalt (Co) crystal layer, ruthenium (Ru) crystal layer or osmium (Os) crystal layer.

Optionally, the amorphous metal pad layer may be amorphous Co layer, amorphous Ru layer or amorphous Os layer.

Optionally, a thickness of the amorphous metal pad layer may be within 1 nm~3 nm, a thickness of the metal crystal adhesion layer may be within 1 nm~2 nm.

Optionally, a thickness of the metal crystal adhesion layer may be within 1 nm~5 nm.

Optionally, a metal crystal of the metal crystal adhesion layer may be in hexagonal close-packed (HCP) crystal structure or face-centered cubic (FCC) crystal structure.

Optionally, if the barrier layer comprises the graphene layer, the step of forming a barrier layer at a sidewall and a bottom of the through hole and a sidewall and a bottom of the groove further comprises a step of: through chemical vapor deposition, forming Carbon allotrope at the sidewall and the bottom of the through hole and the sidewall and the bottom of the groove, forming the graphene layer at interface of metal film and the dielectric layer, the barrier layer being an Carbon allotrope/graphene complex layer.

Optionally, if the barrier layer comprises graphene layer, the step of forming a barrier layer at a sidewall and a bottom of the through hole and a sidewall and a bottom of the groove further comprises steps of: through chemical vapor deposition, forming an Carbon allotrope layer at the sidewall and the bottom of the through hole and the sidewall and the bottom of the groove, forming the graphene layer at interface of the Carbon allotrope and the dielectric layer, the barrier layer being an Carbon allotrope/graphene complex layer; and depositing metal and/or metal compound on the Carbon allotrope/graphene complex layer which is on the sidewall of the through hole and the sidewall of the groove as a first barrier layer.

Optionally, a temperature to perform the chemical vapor deposition is within 300° C.~400° C.

Optionally, a thickness of the graphene layer is less than 1 nm.

Optionally, the first barrier layer may be a TaN layer or TaN/Ta multilayers.

Another aspect of the present invention provides a Cu interconnect, forming in a through hole and a groove of a dielectric layer on a substrate, wherein the Cu interconnect comprises a barrier layer forming at a sidewall and a bottom of the through hole and a sidewall and a bottom of the groove and a Cu interconnecting line forming on the barrier layer and filling the through hole and groove, and the barrier layer comprises a metal crystal adhesion layer or comprises a graphene layer.

Optionally, the metal crystal adhesion layer may be Co crystal layer or Ru crystal layer or Os crystal layer.

Optionally, a thickness of the metal crystal adhesion layer may be within 1 nm~5 nm.

Optionally, a metal crystal of the metal crystal adhesion layer may be in HCP crystal structure or FCC crystal structure.

Optionally, a first barrier layer may be formed between the metal crystal adhesion layer the through hole and the groove.

Optionally, an amorphous metal pad layer may be formed between the metal crystal adhesion layer and the first barrier layer.

Optionally, the amorphous metal pad layer may be amorphous Co layer, amorphous Ru layer or amorphous Os layer.

Optionally, a thickness of the amorphous metal pad layer may be within 1 nm~3 nm, a thickness of the metal crystal adhesion layer is within 1 nm~2 nm.

Optionally, a thickness of the metal crystal adhesion layer may be within 1 nm~5 nm.

Optionally, a metal crystal of the metal crystal adhesion layer may be in HCP crystal structure or FCC crystal structure.

Optionally, the graphene layer may be an Carbon allotrope layer/graphene complex layer, and the graphene layer may be formed at an interface between the Carbon allotrope layer and the through hole and the groove.

Optionally, a first barrier layer may be formed on the Carbon allotrope layer/graphene complex layer.

Optionally, a thickness of the graphene layer may be less than 1 nm.

Optionally, the first barrier layer may be a TaN layer or TaN/Ta multilayers.

As mentioned above, the Cu interconnect and method of forming a Cu interconnect of damascene process according to the present invention may bring at least these benefits: when forming the Cu interconnect, at first, the barrier layer may be formed at the sidewall and the bottom of the through hole and the groove of the dielectric layer, the barrier layer comprising the metal crystal adhesion layer or comprising the graphene layer. The metal crystal adhesion layer may be Co crystal layer or Ru crystal layer or Os crystal layer. In the present invention, at first, the first barrier layer may also be formed at the sidewall and the bottom of the through hole and the groove, and then, through physical vapor deposition, the metal crystal adhesion layer may be directly formed. The first barrier layer may effectively inhibit affecting the metal crystal from impurity in the dielectric layer and provide ordered crystal due to high purity and high energy of the metal crystal adhesion layer crystal formed with the physical vapor deposition. Or, at first, an amorphous metal pad layer may be formed on the sidewall and the bottom of the through hole and the groove through chemical vapor deposition, and then through physical vapor deposition, the metal crystal adhesion layer may be formed. The metal crystal adhesion layer may enhance adhesion of Cu, inhibit diffusion of Cu toward a dielectric layer efficiently, and promoting electro-migration of Cu. The metal crystal adhesion layer may efficiently reduce the total thickness of the barrier layer and the first barrier layer to efficiently decrease resistance of the through hole.

In some embodiments, the barrier layer may comprise the graphene layer. The graphene layer may be an Carbon allotrope and graphene complex layer. At a temperature within 300° C.~400° C., Carbon allotrope may be formed at the sidewall and the bottom of the through hole and the groove. During this time, a thin graphene layer may be formed at an interface of the Carbon allotrope and the dielectric layer. The first barrier layer may be formed between the Carbon allotrope layer and the graphene layer and Cu, but it may be not formed either. The graphene layer may provide lower resistance for the Cu interconnect, improve interface between the graphene layer and Cu, so as to promote breakdown current density of the Cu interconnect and extend lifetime of the electro-migration. As such, reliability of the Cu interconnect is improved. The graphene layer may also efficiently reduce the total thickness of the barrier layer and the first barrier layer to efficiently decrease resistance of the through hole.

BRIEF DESCRIPTION OF THE DRAWINGS

Various objects and advantages of the present invention will be more readily understood from the following detailed description when read in conjunction with the appended drawing as follows.

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please note that the drawings provided here are only for examples but not limited to the specific number or scale shown therein. When implementing the examples according to the drawings, condition, number, shape, size, relative position and proportion of each element may be changed and arrangement of the elements may be in a more complex way.

First Embodiment

Figure 14:
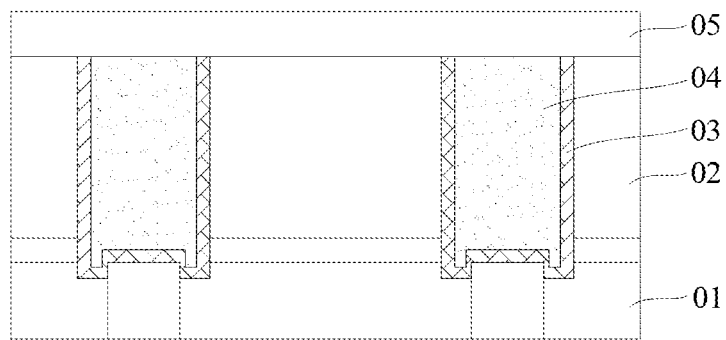
FIG. 14 shows a structure of a conventional Cu interconnect.

In a traditional method of forming a copper (Cu) interconnect of damascene process, as shown in FIG. 14, a Cu interconnect is formed in a dielectric layer 02 which is on a substrate 01. The dielectric layer 02 is usually a low-k dielectric layer, and copper 04 in the Cu interconnect easily diffuses toward surrounding low-k dielectric layer 02, so as to decrease Cu's electro-mobility. To prevent from the diffusion toward the dielectric layer 02, in a traditional technology, a barrier layer 03 is formed at a sidewall of a through hole or a groove, used to form the interconnect. As shown in FIG. 14, taking the through hole for example, the metal barrier layer 03 is formed at the sidewall and a bottom of the through hole. The barrier layer is usually a Ta, TaN layer or Ta and TaN multilayers. For a conventional interconnect layer, the metal barrier layer may effectively inhibit Cu's diffusion. However, as CMOS devices keep shrinking, Ta, TaN layer or Ta and TaN multilayer is getting thinner and thinner, and at this time, the effect of the metal barrier layer in decreasing resistance of the through hole, promoting Cu's adhesion and ensuring Cu's electro-mobility is greatly decreased and too low to satisfy requirements. Therefore, a replacement material to satisfy required performance of the barrier layer for a CMOS device which size is getting smaller and smaller is needed.

Figure 1:
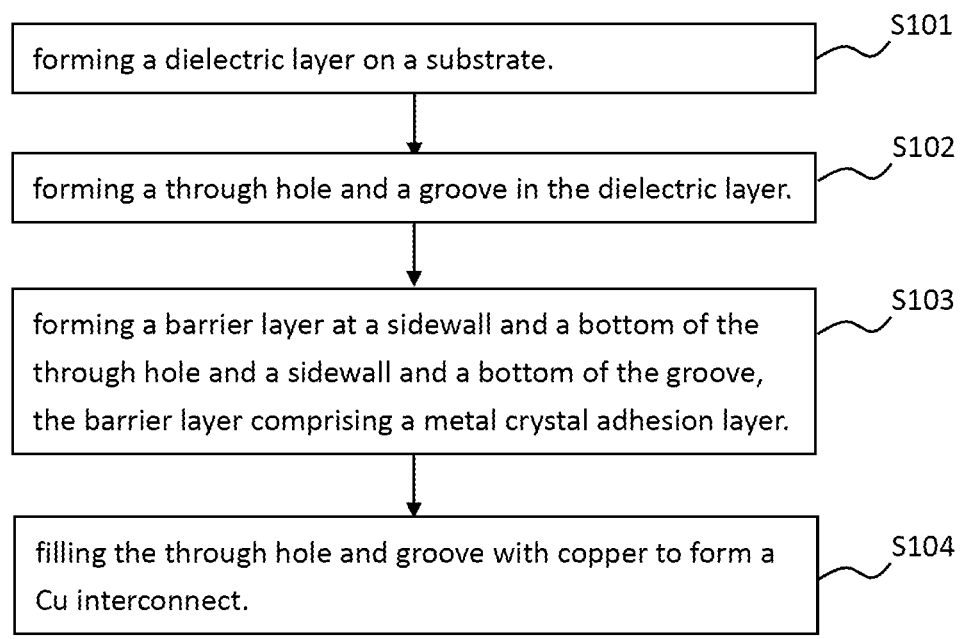
FIG. 1 shows a flow chart of a method of forming a Cu interconnect of damascene process in a first embodiment according to the present invention.
Figure 2:
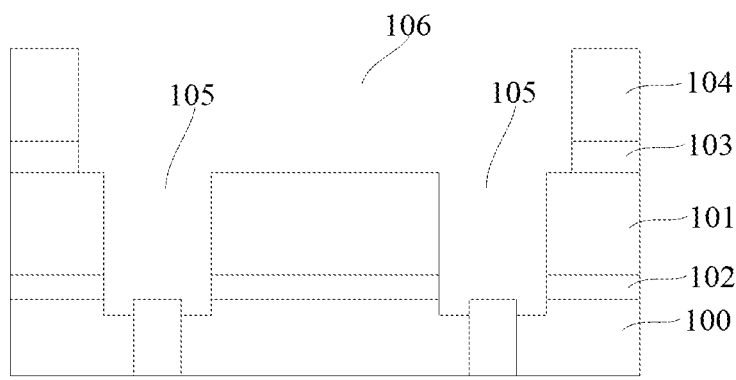
FIG. 2 shows a structure of through holes and a groove formed in the dielectric layer on a substrate.

Aiming above-mentioned requirement, the present embodiment provides a method of forming a Cu interconnect of damascene process to form the barrier layer comprising a metal crystal adhesion layer at a sidewall and a bottom of a through hole and a groove for forming the Cu interconnect, so as to inhibit Cu's migration and diffusion toward a surrounding dielectric layer. As shown in FIG. 1, the method comprises steps of: step S101: forming a dielectric layer on a substrate; the substrate of the present embodiment may be chosen to meet an actual requirement of a device. For example, the substrate may comprise silicon substrate germanium (Ge) substrate, silicon germanium (SiGe) substrate, SOI (silicon-on-insulator) substrate or GOI (germanium-on-insulator) substrate, etc. As shown in FIG. 2, in the present embodiment, the substrate 100 is silicon substrate. The substrate may be a blank substrate 100 on which a layer for devices is not yet formed, and a substrate 100 on which semiconductor devices are formed. On the substrate 100, a dielectric layer is formed. The dielectric layer may comprise a first dielectric layer 101 for forming the through hole and a second dielectric layer 104 for forming the groove. Between the first dielectric layer 101 and the substrate 100, a first etching stopping layer 102 may be formed. Between the second dielectric layer 104 and the first dielectric layer 101, a second etching stopping layer 103 may be formed. The dielectric layer (the first dielectric layer 101 and the second dielectric layer 104) may be low-k dielectric layer, such as SiCOH or SiOF. The first and second etching stopping layers 102, 103 may be silicon nitride layer.

Figure 3:
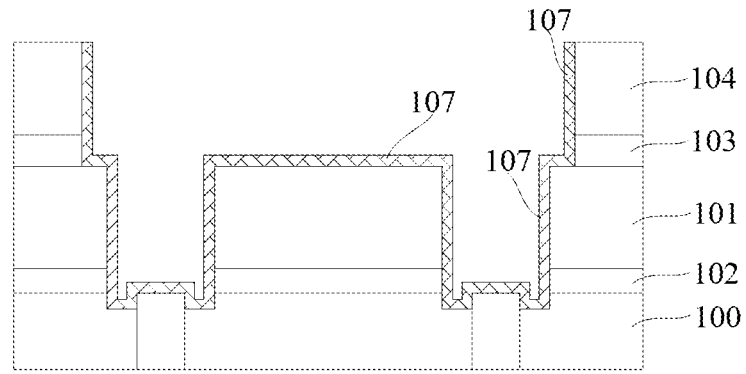
FIG. 3 shows a structure of a first barrier layer formed in a sidewall and a bottom of the through holes and groove.

Step S102: forming the through hole and the groove in the dielectric layer. As shown in FIG. 3, forming the through hole 105 and the groove 106 in the first dielectric layer 101 and the second dielectric layer 104 respectively. The through hole 105 passes through the first dielectric layer 101 and first etching stopping layer 102, and connects to the substrate 100. In the substrate 100 formed with devices, the through hole 105 connects to the devices in the substrate 100. The groove 106 passes through the second dielectric layer 104 and the second etching stopping layer 103, and connects to the through hole. In a dual damascene process, at first, the through hole 105 may be formed, and then the groove 106 may be formed. Further, the groove 106 may be formed first, and then the through hole 105 may be formed. Yet further, the through hole 105 and groove 106 may be formed at the same time.

Step S103: the barrier layer may be formed at the sidewall and the bottom of the through hole and the sidewall and the bottom of the groove, the barrier layer comprising metal crystal adhesion layer. Please note that two conditions need to be satisfied when forming the metal crystal adhesion layer: providing metal or metal compound as the barrier layer to eliminate effect of impurity in the dielectric layer to metal crystal; through physical vapor deposition (PVD) technology, obtaining material of the metal crystal. The latter is because that through PVD, the obtained material has very high purity and great energy to form ordered crystal. Considering these facts, in the present embodiment, at first, as shown in FIG. 3, a layer metal layer or metal compound layer is formed at the sidewall and the bottom of the through hole 105 and the groove 106 as a first barrier layer 107. In some preferred embodiments, the first barrier layer 107 may be metal Ta layer, TaN layer or Ta and TaN multilayers.

Figure 4:
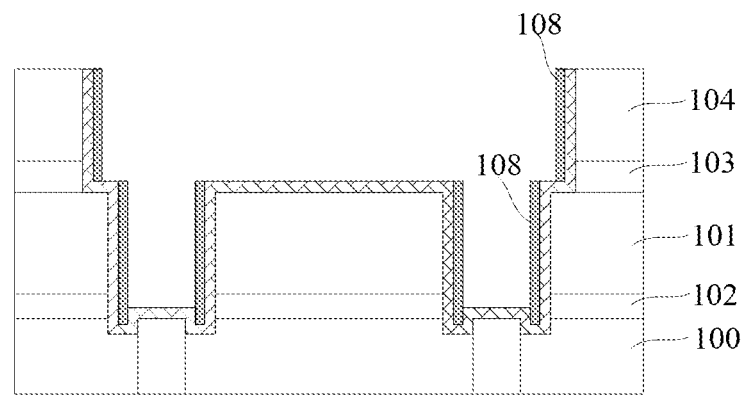
FIG. 4 shows a structure of a metal crystal adhesion layer formed on the first barrier layer.

Then, as shown in FIG. 4, on the first barrier layer 107, a single layer of a metal crystal adhesion layer 108 is deposited through PVD. Preferably, on the first barrier layer which is on the sidewall of the through hole 105 and the groove 106, the metal crystal adhesion layer is formed. The metal crystal adhesion layer may be Co crystal layer, Ru crystal layer or Os crystal layer. In preferred embodiments, the metal crystal adhesion layer may be formed with very-high frequency sputter (VHF sputter), radio frequency sputter (RF sputter), pulse sputter or direct current sputter (DC sputter). Thickness of the formed metal crystal adhesion layer 108 may be within about 1 nm~5 nm.

In the metal crystal adhesion layer, metal crystal may be in hexagonal close-packed (HCP) crystal structure or face-centered cubic (FCC) crystal structure. HCP crystal structure allows lower surface energy in the metal crystal, so as to provides greater adhesion.

Figure 5:
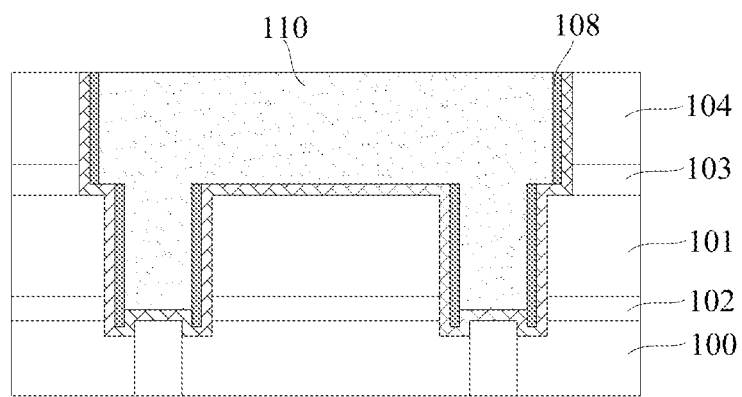
FIG. 5 shows a structure of Cu filling in the structure shown in FIG. 4 to form a Cu interconnect.

Step S104: filling Cu in the through hole and the groove to form a Cu interconnect. After forming the metal crystal adhesion layer 108, as shown in FIG. 5, filling Cu 110 in the through hole 105 and the groove 106 to form the Cu interconnect. For instance, at first, copper may be filled in the through hole 105 and groove 106, and then through chemical mechanical polishing (CMP), the Cu interconnect shown in FIG. 5 may be formed.

Figure 6:
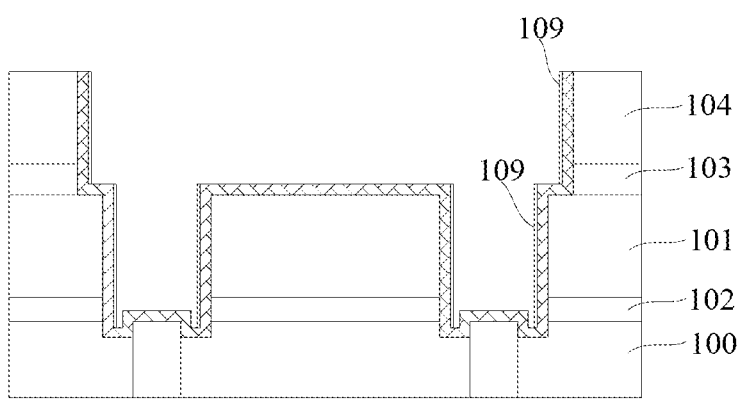
FIG. 6 shows a structure of an amorphous metal pad layer formed on the first barrier layer.
Figure 7:
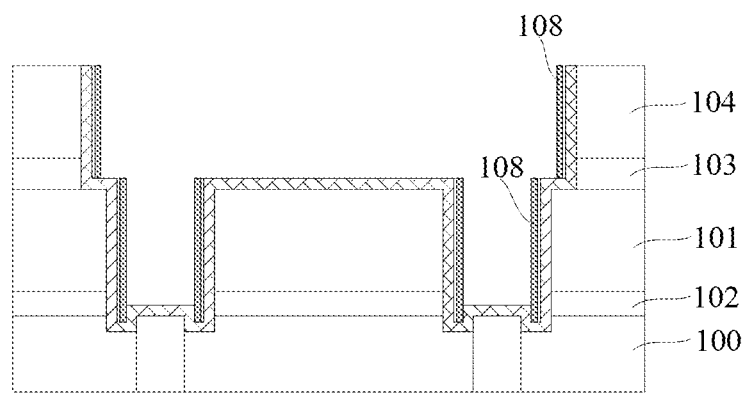
FIG. 7 shows a structure of the metal crystal adhesion layer formed on the amorphous metal pad layer shown in FIG. 6.
Figure 8:
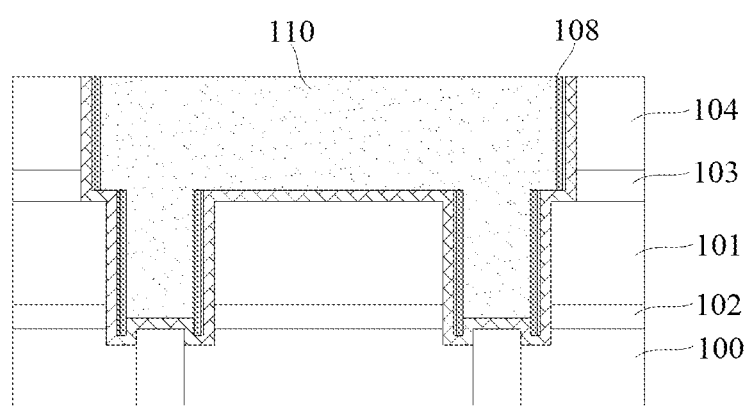
FIG. 8 shows a structure of Cu filling in the structure shown in FIG. 7 to form a Cu interconnect.

In a preferred embodiment, as shown in FIG. 6, after forming the first barrier layer 107 at the sidewall and the bottom of the through hole 105 and the groove 106, at first, through chemical vapor deposition (CVD) technology, an amorphous metal pad layer 109 is formed on the first barrier layer 107. The amorphous metal pad layer 109 may comprise the same metal element as the metal crystal adhesion layer 108 formed later. Preferably, the amorphous metal pad layer 109 may be formed on the first barrier layer 107 which is on the sidewall of the through hole 105 and groove 106. The amorphous metal pad layer may raise coverage rate of the groove 106 and the through hole 105. Then, as shown in FIG. 7, the metal crystal adhesion layer 108 may be formed on the amorphous metal pad layer 109 through PVD technology. Thickness of the amorphous metal pad layer 109 may be within 1 nm~3 nm, and thickness of the metal crystal adhesion layer 108 may be within 1 nm~2 nm.

The method illustrated in the present embodiment may be used to form the metal crystal adhesion layer 108 with high purity, high energy and ordered arrangement in a long range. In the metal crystal adhesion layer 108, metal crystal may be in HCP or FCC crystal structure. HCP crystal structure allows lower surface energy in the metal crystal, so as to provides greater adhesion. The metal crystal adhesion layer 108 enhances adhesion of copper, inhibits diffusion of copper toward the dielectric layer effectively, and benefits raising electro-mobility of copper. Meanwhile, the metal crystal adhesion layer 108 may reduce total thickness of the barrier layer to reduce resistance of the through hole effectively.

The present embodiment also provide a Cu interconnect formed through aforesaid method. Referring to FIG. 5, the Cu interconnect may be formed in the dielectric layer on the substrate 100. The Cu interconnect may comprise the barrier layer 107 formed at the sidewall and the bottom of the through hole 105 and the sidewall and the bottom and the groove 106 and a Cu interconnecting line formed at the through hole 105 and groove 106 filling on the barrier layer 107. The barrier layer 107 may comprise the metal crystal adhesion layer 108. The metal crystal adhesion layer 108 may be Co crystal layer, Ru crystal layer or Os crystal layer. Preferably, the metal crystal adhesion layer 108 may be formed on the sidewall of the through hole 105 and the groove 106. In the metal crystal adhesion layer 108, the metal crystal may be in HCP or FCC crystal structure. HCP crystal structure allows lower surface energy in the metal crystal, so as to provides greater adhesion. Thickness of the metal crystal adhesion layer 108 may be within 1 nm~5 nm to reduce total thickness of the barrier layer 107, so as to reduce resistance of the through hole 105.

Between the metal crystal adhesion layer 108 and the through hole 105 and the groove 106, the first barrier layer 107 may be formed. The first barrier layer may be formed at the sidewall and the bottom of the through hole 105 and the groove 106. The first barrier layer 107 may inhibit effect of impurity in the dielectric layer to the metal crystal adhesion layer 108.

In an preferred embodiment, between the metal crystal adhesion layer 108 and Cu 110, the amorphous metal pad layer 109 may be formed. The amorphous metal pad layer 109 may be amorphous Co layer, amorphous Ru layer or amorphous Os layer. Further, the amorphous metal pad layer 109 may be formed with the same metal element as that of the metal crystal adhesion layer 108. The amorphous metal pad layer 109 facilitate raising coverage rate of the through hole 105 and groove 106. In the preferred embodiment, thickness of the amorphous metal pad layer may be within 1 nm~3 nm, and thickness of the metal crystal adhesion layer 108 may be within 1 nm~2 nm. In the preferred embodiment, total thickness of the barrier layer may not be raised and meanwhile coverage uniformity of the through hole 105 and the groove 106 may be promoted.

Second Embodiment

Figure 9:
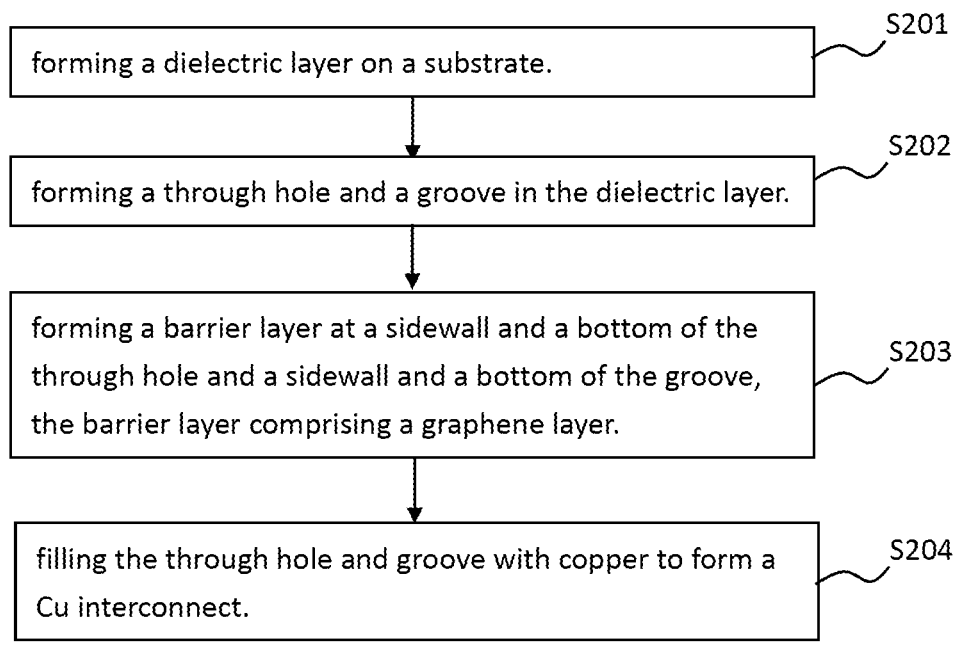
FIG. 9 shows a flow chart of a method of forming a Cu interconnect of damascene process in a second embodiment according to the present invention.

In the present embodiment, a method of forming a Cu interconnect of damascene process is provided. A barrier layer comprising a metal crystal adhesion layer is formed at a sidewall and a bottom of a through hole and a groove of a Cu interconnect to effectively inhibit copper's migration and diffusion toward surrounding dielectric layer. As shown in FIG. 9, the method may comprise steps of: step S201: forming a dielectric layer on a substrate; step S202: forming a through hole and a groove in the dielectric layer; step S203: forming a barrier layer at a sidewall and a bottom of the through hole and a sidewall and a bottom of the groove, the barrier layer comprising a graphene layer; and step S204: filling the through hole and the groove with copper to form the Cu interconnect.

Figure 10:
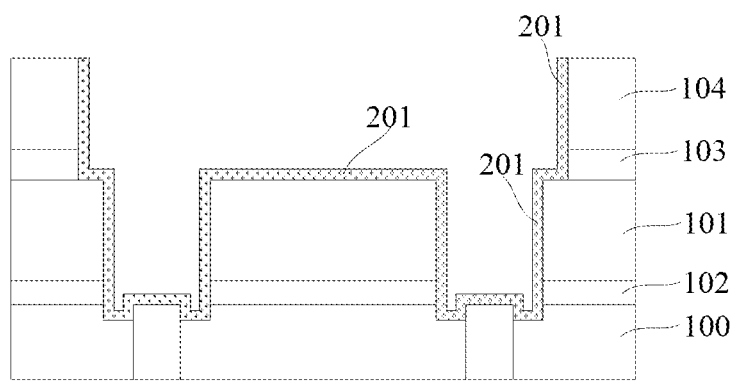
FIG. 10 shows a structure of a graphene layer formed in a sidewall and a bottom of the through holes and groove of a dielectric layer on a substrate.

Above-mentioned step S201, step S202 and step S204 are the same as the step S101, step S102 and step S104 in the first embodiment, and they are not repeated here. The differences between the present embodiment and the first embodiment are mainly in the step S203, illustrated as follows: in the present embodiment, after forming the through hole 105 and groove 106 as shown in FIG. 2, as shown in FIG. 10, an Carbon allotrope layer is deposited at the sidewall and bottom of the through hole 105 and the groove 106. Specifically, at a temperature within 300° C.~400° C., applying with CVD technology, the Carbon allotrope layer may be deposited, during which, a thin layer of a graphene layer may be formed at an interface between Carbon allotrope and the dielectric layer forming the through hole 105 and groove 106. As such, in the present embodiment, the graphene layer is an Carbon allotrope/graphene complex layer 201 actually. Thickness of the Carbon allotrope/graphene complex layer 201 may be within 1 nm~5 nm, and thickness of the formed graphene layer may be less than 1 nm.

Figure 11:
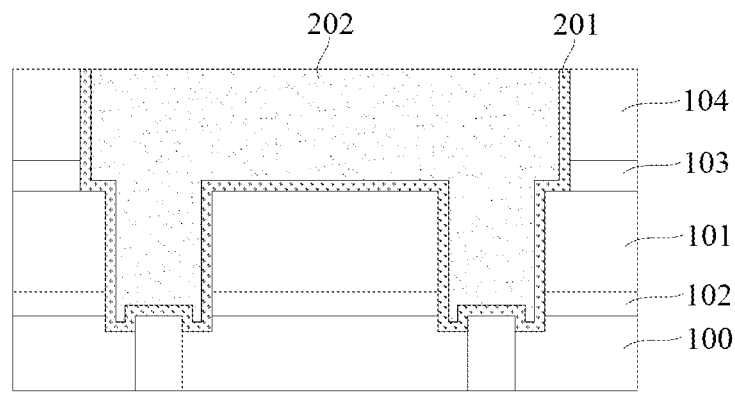
FIG. 11 shows a structure of Cu filling in the structure shown in FIG. 10 to form a Cu interconnect.

After forming the graphene layer, the step S204 may be performed. As shown in FIG. 11, the through hole 105 and groove 106 may be filled with copper 202 to form the Cu interconnecting line. In the present embodiment, the Carbon allotrope/graphene complex layer 201 itself may be served as the barrier layer between copper and the dielectric layer because graphene and Carbon allotrope have great interface characteristics to effectively inhibit copper's migration or diffusion. Meanwhile, thickness of the barrier layer may be reduced to reduce resistance of the through hole 105.

Figure 12:
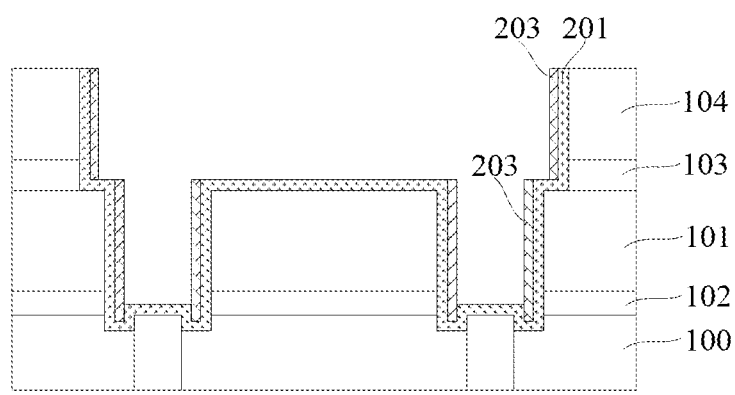
FIG. 12 shows a structure of the first barrier layer formed on the graphene layer shown in FIG. 10.

In a preferred embodiment, after forming the graphene layer, as shown in FIG. 12, a step of forming metal and/or metal compound layer on the graphene layer as a first barrier layer 203 may be comprised. The first barrier layer 203 may be metal Ta layer, TaN layer or Ta and TaN multilayers. Preferably, the first barrier layer 203 may be formed on the graphene layer formed on the sidewall of the through hole and groove.

Figure 13:
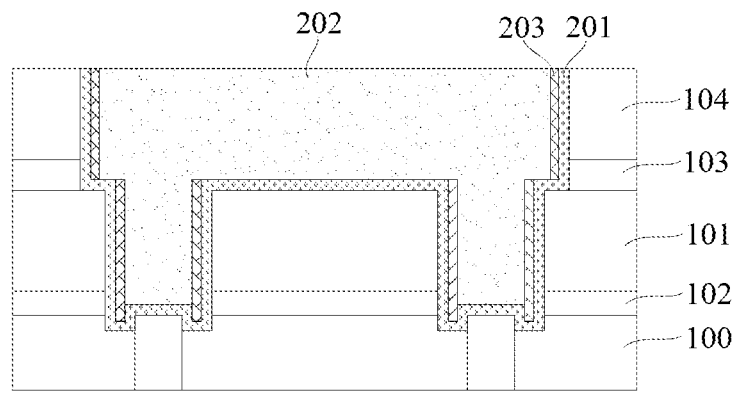
FIG. 13 shows a structure of Cu filling in the structure shown in FIG. 12 to form a Cu interconnect.

After forming the graphene layer and the first barrier layer 203, as shown in FIG. 13, the groove and through hole are filled with copper 202 to form the Cu interconnect. In the preferred embodiment, because the graphene layer provides a great barrier, thickness of the first barrier layer 203 may be reduced, so as not to increase total thickness of the barrier layer. In such a case, a great barrier is still provided, and resistance of through hole is still reduced.

The Cu interconnect may be formed with one of above-mentioned methods. Referring to FIG. 11, the Cu interconnect may be formed at the dielectric layer on the substrate. The Cu interconnect may comprise the barrier layer formed at the sidewall and the bottom of the through hole and the sidewall and the bottom of the groove and the Cu interconnecting line filling the through hole and the groove on the barrier layer. The barrier layer may comprise a graphene layer 201. In the present embodiment, the graphene layer is Carbon allotrope/graphene complex layer actually. Total thickness of the Carbon allotrope/graphene complex layer 201 may be within 1 nm~5 nm, and thickness of the formed graphene layer may be within 1 nm. The Carbon allotrope/graphene complex layer 201 itself may be used as the barrier layer between copper and the dielectric layer because of great interface characteristics graphene and Carbon allotrope have, so as to effectively inhibit copper's migration or diffusion. Meanwhile, thickness of the barrier layer may be reduced to lower resistance of the through hole.

In a preferred embodiment, between the graphene layer and copper, the first barrier layer 203 may be formed. Preferably, the first barrier layer 203 may be formed on the graphene layer on the sidewall of the through hole and the groove. The first barrier layer 203 may be metal Ta layer, TaN layer or Ta and TaN multilayers. In the preferred embodiment, because of great barrier the graphene layer provides, thickness of the first barrier layer may be reduced, and given that total thickness of the barrier layer is not increased, a better barrier may be still provided, and resistance of the through hole may be still reduced.

As mentioned above, the Cu interconnect and method of forming a Cu interconnect of damascene process according to the present invention may bring at least these benefits: when forming the Cu interconnect, at first, the barrier layer may be formed at the sidewall and the bottom of the through hole and the groove of the dielectric layer, the barrier layer comprising the metal crystal adhesion layer or comprising the graphene layer. The metal crystal adhesion layer may be Co crystal layer or Ru crystal layer or Os crystal layer. In the present invention, at first, the first barrier layer may also be formed at the sidewall and the bottom of the through hole and the groove, and then, through physical vapor deposition, the metal crystal adhesion layer may be directly formed. The first barrier layer may effectively inhibit affecting the metal crystal from impurity in the dielectric layer and provide ordered crystal due to high purity and high energy of the metal crystal adhesion layer crystal formed with the physical vapor deposition. Or, at first, an amorphous metal pad layer may be formed on the sidewall and the bottom of the through hole and the groove through chemical vapor deposition, and then through physical vapor deposition, the metal crystal adhesion layer may be formed. The metal crystal adhesion layer may enhance adhesion of Cu, inhibit diffusion of Cu toward a dielectric layer efficiently, and promoting electro-migration of Cu. The metal crystal adhesion layer may efficiently reduce the total thickness of the barrier layer and the first barrier layer to efficiently decrease resistance of the through hole.

In some embodiments, the barrier layer may comprise the graphene layer. The graphene layer may be an Carbon allotrope and graphene complex layer. At a temperature within 300° C.~400° C., Carbon allotrope may be formed at the sidewall and the bottom of the through hole and the groove. During this time, a thin graphene layer may be formed at an interface of the Carbon allotrope and the dielectric layer. The first barrier layer may be formed between the Carbon allotrope layer and the graphene layer and Cu, but it may be not formed either. The graphene layer may provide lower resistance for the Cu interconnect, improve interface between the graphene layer and Cu, so as to promote breakdown current density of the Cu interconnect and extend lifetime of the electro-migration. As such, reliability of the Cu interconnect is improved. The graphene layer may also efficiently reduce the total thickness of the barrier layer and the first barrier layer to efficiently decrease resistance of the through hole.

It is to be understood that these embodiments are not meant as limitations of the invention but merely exemplary descriptions of the invention. Indeed, different adaptations may be apparent to those skilled in the art without departing from the scope of the annexed claims.

What is claimed is:

1. A copper (Cu) interconnect, forming in a through hole and a groove of a dielectric layer on a substrate, wherein the Cu interconnect comprises a barrier layer forming at a sidewall and a bottom of the through hole and a sidewall and a bottom of the groove and a Cu interconnecting line forming on the barrier layer and filling the through hole and groove, the barrier layer comprises a metal crystal adhesion layer, a first barrier layer is formed between the metal crystal adhesion layer the through hole and the groove, an amorphous metal pad layer is formed between the metal crystal adhesion layer and the first barrier layer, and the metal crystal adhesion layer is cobalt (Co) crystal layer, ruthenium (Ru) crystal layer or osmium (Os) crystal layer.

2. The Cu interconnect according to claim 1, wherein a thickness of the metal crystal adhesion layer is within 1 nm~5 nm.

3. The Cu interconnect according to claim 1, wherein a metal crystal of the metal crystal adhesion layer is in hexagonal close-packed (HCP) crystal structure or face centered-cubic (FCC) crystal structure.

4. The Cu interconnect according to claim 1, wherein the amorphous metal pad layer is amorphous Co layer, amorphous Ru layer or amorphous Os layer.

5. The Cu interconnect according to claim 4, wherein a thickness of the amorphous metal pad layer is within 1 nm~3 nm, a thickness of the metal crystal adhesion layer is within 1 nm~2 nm.

6. The Cu interconnect according to claim 1, wherein the first barrier layer is a tantalum nitride (TaN) layer or TaN/Ta multilayers.

* * * * *